(12) United States Patent
Orimoto

(10) Patent No.: US 10,049,958 B2
(45) Date of Patent: Aug. 14, 2018

(54) SEMICONDUCTOR DEVICE

(71) Applicant: TOYOTA JIDOSHA KABUSHIKI KAISHA, Toyota-shi, Aichi-ken (JP)

(72) Inventor: Norimune Orimoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/684,449

(22) Filed: Aug. 23, 2017

(65) Prior Publication Data

US 2018/0108591 A1 Apr. 19, 2018

(30) Foreign Application Priority Data

Oct. 18, 2016 (JP) ................................. 2016-204464

(51) Int. Cl.
  *H01L 23/34* (2006.01)
  *H01L 25/18* (2006.01)
  *H01L 23/367* (2006.01)
  *H01L 23/31* (2006.01)

(52) U.S. Cl.
  CPC ........ *H01L 23/345* (2013.01); *H01L 23/3114* (2013.01); *H01L 23/3672* (2013.01); *H01L 25/18* (2013.01)

(58) Field of Classification Search
  None
  See application file for complete search history.

(56) References Cited

U.S. PATENT DOCUMENTS

| | | | | |
|---|---|---|---|---|
| 5,981,085 A | * | 11/1999 | Ninomiya | H01L 21/4871 257/712 |
| 6,870,736 B2 | * | 3/2005 | Lee | H01L 23/42 165/185 |
| 7,654,311 B2 | * | 2/2010 | Yang | H01L 23/34 165/185 |
| 7,786,570 B2 | * | 8/2010 | Eom | H01L 23/367 257/706 |
| 2005/0040515 A1 | * | 2/2005 | Inoue | H01L 23/4006 257/706 |

(Continued)

FOREIGN PATENT DOCUMENTS

JP  2001-217358 A  8/2001
JP  2012-104550 A  5/2012

*Primary Examiner* — Andres Munoz
(74) *Attorney, Agent, or Firm* — Oliff PLC

(57) ABSTRACT

A semiconductor device includes a semiconductor module and a cooler. The semiconductor device includes semiconductor element(s) within a molded resin and a heat sink plate exposed on the molded resin. The cooler includes a cooling plate located on the heat sink plate of the semiconductor module via thermal grease. The cooling plate includes a bimetal structure in which two layers having different linear expansion coefficients are laminated. The heat sink plate includes a first facing surface facing the cooling plate and the semiconductor module is configured to thermally expand such that the first facing surface displaces with respect to the cooling plate. The cooling plate includes a second facing surface facing the heat sink plate, and the bimetal structure is configured to thermally expand such that the second facing surface of the cooling plate displaces in a same direction as the first facing surface of the heat sink plate.

6 Claims, 11 Drawing Sheets

(56) References Cited

U.S. PATENT DOCUMENTS

| | | | |
|---|---|---|---|
| 2008/0290499 A1* | 11/2008 | Nishi | H01L 23/13 257/712 |
| 2009/0102035 A1* | 4/2009 | Hedler | H01L 21/6835 257/686 |
| 2009/0279276 A1* | 11/2009 | Yoshida | H01L 23/367 361/808 |
| 2011/0291258 A1* | 12/2011 | Murayama | F28F 7/00 257/712 |
| 2012/0231584 A1* | 9/2012 | Kawahara | H01L 21/565 438/122 |
| 2013/0307136 A1* | 11/2013 | Yamaguchi | H01L 23/373 257/712 |
| 2016/0071778 A1* | 3/2016 | Otsubo | H01L 21/486 257/687 |
| 2017/0069559 A1* | 3/2017 | Yamamoto | H01L 23/3675 |

* cited by examiner

US 10,049,958 B2

SEMICONDUCTOR DEVICE

TECHNICAL FIELD

The technique disclosed herein relates to a semiconductor device.

BACKGROUND

Japanese Patent Application Publication No. 2012-104550 describes a semiconductor device. This semiconductor device includes a semiconductor module, and a cooler configured to cool the semiconductor module. The semiconductor module includes a semiconductor element encapsulated in molded resin, and a heat sink plate exposed on a surface of the molded resin. The cooler includes a cooling plate located on the heat sink plate of the semiconductor module via thermal grease.

The semiconductor module is subject to temperature-dependent thermal expansion. Thus, a change in temperature of the semiconductor module causes a distance between the semiconductor module and the cooler to change, as a result of which the thermal grease located between them is pushed out or drawn in. When such a behavior of the thermal grease (a so-called pump-out effect) is exhibited, air is drawn inside the thermal grease, and a performance to cool the semiconductor module may thereby be reduced. In regard to this, the semiconductor device of Japanese Patent Application Publication No. 2012-104550 adjusts pressure inside the cooler to deform the cooling plate in accordance with thermal expansion of the semiconductor module.

SUMMARY

However, it is difficult to finely adjust the pressure inside the cooler. Further, the pressure inside the cooler may change unintentionally, in which case the distance between the semiconductor module and the cooler changes, and the aforementioned pump-out effect of the thermal grease may be provoked. The disclosure herein provides a technique capable of suppressing pump-out effect of thermal grease without requiring pressure control inside a cooler.

The description herein discloses a semiconductor device. The semiconductor device comprises a semiconductor module and a cooler. The semiconductor module comprises at least one semiconductor element encapsulated within a molded resin and a heat sink plate exposed on a surface of the molded resin. The cooler comprises a cooling plate located on the heat sink plate of the semiconductor module via thermal grease. The cooling plate comprises a bimetal structure in which a first metal layer and a second metal layer are laminated, the second metal layer having a different linear expansion coefficient from the first metal layer. The heat sink plate comprises a first facing surface facing the cooling plate, the semiconductor module being configured to thermally expand with a rise in temperature of the semiconductor module such that the first facing surface displaces with respect to the cooling plate. The cooling plate comprises a second facing surface facing the heat sink plate, the bimetal structure of the cooling plate being configured to thermally expand with a rise in temperature of the cooling plate such that the second facing surface of the cooling plate displaces in a same direction as the first facing surface of the heat sink plate.

In the aforementioned semiconductor device, when the temperature of the semiconductor module rises, the (first) facing surface of the heat sink plate facing the cooling plate displaces relative to the cooling place due to the thermal expansion of the semiconductor module. Further, the temperature of the cooling plate in the cooler also rises accompanying the rise in the temperature of the semiconductor module. When the temperature of the cooling plate rises, the second facing surface of the cooling plate facing the heat sink plate displaces in the same direction as the first facing surface of the heat sink plate by the thermal expansion of the bimetal structure. That is, for example, in an embodiment in which the first facing surface of the heat sink plate is configured to displace towards the second facing surface of the cooling plate, the second facing surface of the cooling plate displaces so as to separate away from the first facing surface of the heat sink plate. Due to this, a change in a distance between two facing surfaces that intervene the thermal grease therebetween can be suppressed even when the temperature of the semiconductor module changes. That is, a pump-out effect of the thermal grease is suppressed.

DETAILED DESCRIPTION

Figure 1:
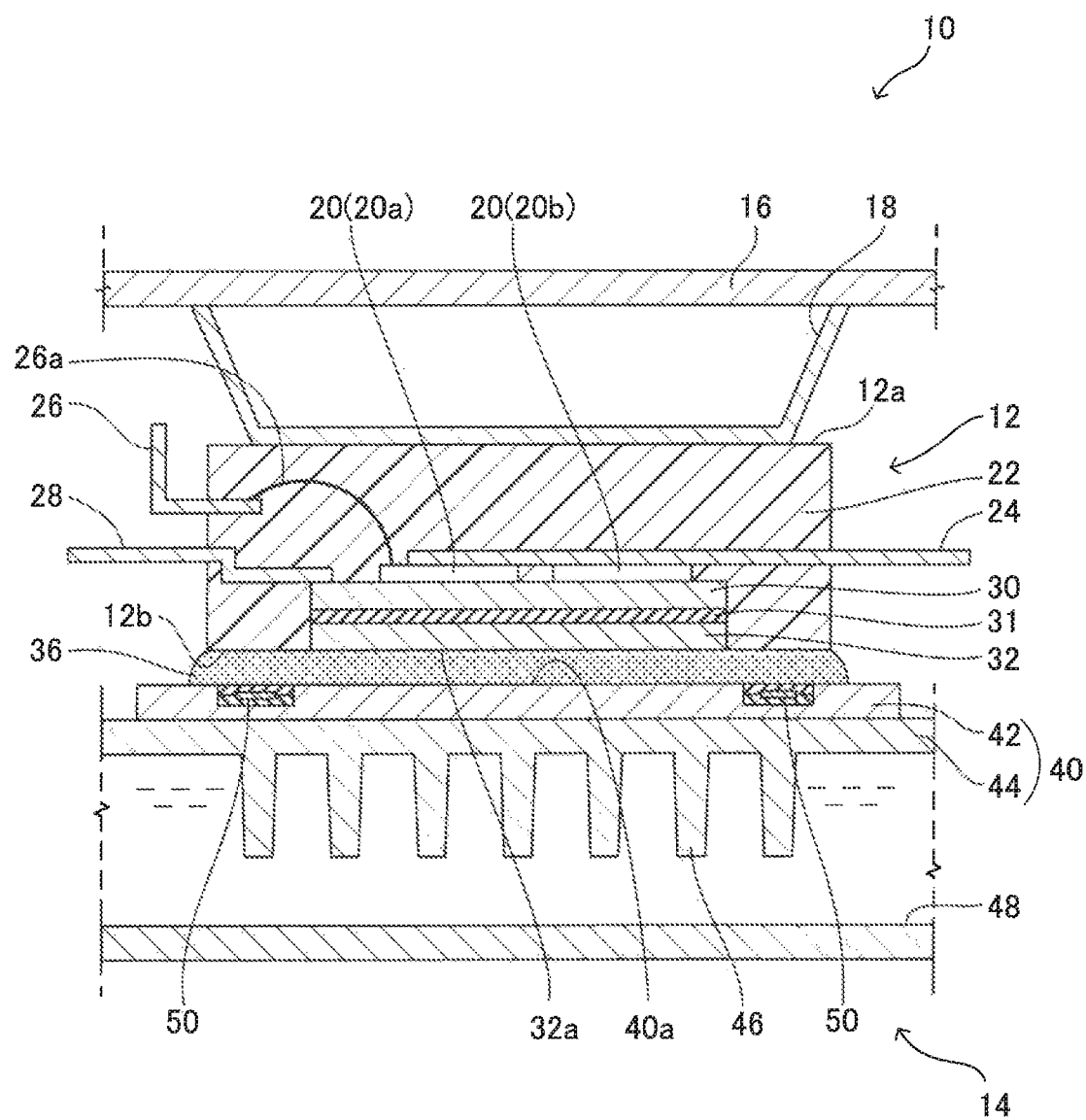
FIG. 1 schematically shows a configuration of a semiconductor device 10 of a first embodiment.

In an embodiment of the disclosure herein, a semiconductor device may further comprise an adjuster configured to adjust an amount of displacement of at least one of a second facing surface of a cooling plate and a first facing surface of a heat sink plate in accordance with temperature of a semiconductor module. According to such a configuration, in a case for example where individual differences reside in thermal deformation of semiconductor modules, the displacement amount of at least one of the second facing surface of the cooling plate and the first facing surface of the heat sink plate can appropriately be adjusted in each semiconductor module. Alternatively, for example in a case where there is a delay in a change of temperature of the cooling plate relative to a change of temperature of the semiconductor module as well, the displacement amount of at least one of the second facing surface of the cooling plate and the first facing surface of the heat sink plate can appropriately be adjusted.

In the aforementioned embodiment, the adjuster may comprise at least one heater configured to heat the cooling plate; and a heater controller configured to adjust an amount of heat generation of the at least one heater in accordance with the temperature of the semiconductor module. According to such a configuration, the displacement amount of the second facing surface of the cooling plate can be adjusted by heating a bimetal structure by the at least one heater and adjusting the thermally expanding amount thereof.

In the aforementioned embodiments, the semiconductor module may comprise a first semiconductor element and a second semiconductor element. Further, the at least one heater may comprise a first heater configured to heat the second facing surface of the cooling plate in a first range close to the first semiconductor element; and a second heater configured to heat the second facing surface of the cooling plate in a second range close to the second semiconductor element. Further, the heater controller may be configured to adjust an amount of heat generation of the first heater in accordance with temperature of the first semiconductor element and adjust an amount of heat generation of the second heater in accordance with temperature of the second semiconductor element. According to such a configuration, the displacement amount of the second facing surface of the cooling plate can appropriately be adjusted in accordance with the temperatures of the respective semiconductor elements even if the temperatures differ between the first and second semiconductor elements.

In addition to the above, or as an alternative thereof, the adjuster may comprise a plate actuator configured to deform the cooling plate by applying force to the cooling plate; and an actuator controller configured to adjust an operation of the plate actuator in accordance with the temperature of the semiconductor module. According to such a configuration as well, the displacement amount of the second facing surface of the cooling plate can appropriately be adjusted in accordance with the temperature of the semiconductor module (for example, the temperature of the semiconductor element). Further, compared to an embodiment of heating the cooling plate, an influence on cooling performance of the cooler can be minimized.

In addition to the above, or as an alternative thereof, the adjuster may comprise a module actuator configured to deform the semiconductor module by applying force to the semiconductor module; and an actuator controller configured to adjust an operation of the module actuator in accordance with the temperature of the semiconductor module. According to such a configuration, the displacement amount of the first facing surface of the heat sink plate can be adjusted in accordance with the temperature of the semiconductor module (for example, the temperature of the semiconductor element). Further, compared to the embodiment of heating the cooling plate, the influence on the cooling performance of the cooler can be minimized.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

A semiconductor device 10 of a first embodiment will be described with reference to the drawings. As shown in FIG. 1, the semiconductor device 10 includes a semiconductor module 12, and a cooler 14 configured to cool the semiconductor module 12. The cooler 14 houses a coolant channel 48 in which coolant flows, and cools the semiconductor module 12 by collecting heat from the semiconductor module 12 using the coolant. The semiconductor module 12 is pressed onto the cooler 14 by a pressing plate 16 and a pressing sprint 18.

The semiconductor module 12 includes a molded resin 22, a plurality of semiconductor elements 20 encapsulated inside the molded resin 22, and a heat sink plate 32 exposed on a surface 12b of the molded resin 22. The heat sink plate 32 is thermally connected to the plurality of semiconductor elements 20, and is configured to discharge heat from the plurality of semiconductor elements 20 to outside. Here, the molded resin 22 has a substantially plate-like shape, and the surface 12b where the heat sink plate 32 is exposed is located on an opposite side from a surface 12a that is pressed by the pressing spring 18. Hereinbelow, the surface 12b of the molded resin 22 where the heat sink plate 32 is exposed may be termed a lower surface 12b of the semiconductor module 12, and the surface 12a of the molded resin 22 located on the opposite side of the lower surface 12b may be termed an upper surface 12a of the semiconductor module 12.

A specific configuration of the semiconductor module 12 is not particularly limited. Although this is merely an example, the semiconductor module 12 of the present embodiment includes four semiconductor elements 20, namely a first semiconductor element 20a, a second semiconductor element 20b, a third semiconductor element 20c, and a fourth semiconductor element 20d (see FIG. 2). The first semiconductor element 20a and the third semiconductor element 20c are switching elements such as IGBTs (Insulated Gate Bipolar Transistors) or MOSFETs (Metal-Oxide-Semiconductor Field-Effect Transistors), and the second semiconductor element 20b and the fourth semiconductor element 20d are diodes. The plurality of semiconductor elements 20 is located on a conductive base plate 30 constituted for example of metal material, and each of them is electrically connected to the base plate 30. The base plate 30 is laminated on the heat sink plate 32 via an insulating layer 31, and thermally connects the plurality of semiconductor elements 20 to the heat sink plate 32. The semiconductor module 12 is provided with a positive terminal 28, a negative terminal 24, and a signal terminal 26 respectively extending from inside to outside of the molded resin 22. The positive terminal 28 is electrically connected to the base plate 30 within the molded resin 22, the negative terminal 24 is electrically connected to the plurality of semiconductor elements 20 within the molded resin 22, and the signal terminal 26 is connected to signal pads (not shown) of the plurality of semiconductor elements 20 via wires 26a.

The cooler 14 includes a cooling plate 40. The cooling plate 40 defines the coolant channel 48, and is located on the heat sink plate 32 of the semiconductor module 12 via thermal grease 36. Hereinbelow, an outer surface 40a of the cooling plate 40 facing the heat sink plate 32 will be termed a facing surface 40a of the cooling plate 40, and an outer surface 32a of the heat sink plate 32 facing the cooling plate 40 will be termed a facing surface 32a of the heat sink plate 32. The facing surface 40a of the cooling plate 40 faces the facing surface 32a of the heat sink plate 32 via the thermal grease 36.

The cooling plate 40 has a bimetal structure in which a first metal layer 42, and a second metal layer 44, having a different linear expansion coefficient from that of the first metal layer 42, are laminated. The first metal layer 42 is located on an outer side of the second metal layer 44 (i.e., on a semiconductor module 12 side). Metals constituting the first metal layer 42 and the second metal layer 44 are not particularly limited. As an example, in this embodiment, the first metal layer 42 is constituted of copper, and the second metal layer 44 is constituted of aluminum. The linear expansion coefficient of the first metal layer 42 is $17.7 \times 10^{-6}$/K, and the linear expansion coefficient of the second metal layer 44 is $23.4 \times 10^{-6}$/K. That is, the linear expansion coefficient of the second metal layer 44 is larger than the linear expansion coefficient of the first metal layer 42. Thus, when temperature of the cooling plate 40 rises, the cooling plate 40 deforms so that a shape of the facing surface 40a of the cooling plate 40 shifts into a concaved shape (or returns to a flat shape from having been in a convex shape). Here, an amount of deformation of the cooling plate 40 caused by temperature can suitably be designed based on a relationship of the linear expansion coefficients of the first metal layer 42 and the second metal layer 44, as well as on a relationship of thicknesses of the first metal layer 42 and the second metal layer 44. Notably, as compared to the second metal layer 44, a metal material having a larger thermal capacity or a metal material having a higher thermal conductivity may be employed for the first metal layer 42 located on the semiconductor module 12 side. Further, the second metal layer 44 may be provided with a plurality of heat discharging fins 46 that protrudes into the coolant channel 48.

As shown in FIGS. 1 to 4, the semiconductor device 10 further includes a heater 50 configured to heat the cooling plate 40, and a heater controller 58 configured to control the heater 50. The heater controller 58 adjusts a heat generation amount in the heater 50 in accordance with temperature of the semiconductor module 12. The temperature of the semiconductor module 12 may for example be temperature(s) of one or more semiconductor elements 20. In this case, a temperature signal outputted by each semiconductor element 20 may be used. The heater 50 and the heater controller 58 are examples of an adjuster configured to adjust an amount of displacement of the facing surface 40a of the cooling plate 40 in accordance with the temperature of the semiconductor module 12. That is, when the heater 50 heats the cooling plate 40, the cooling plate 40 having the bimetal structure deforms. Due to this, the facing surface 40a of the cooling plate 40 displaces relative to the semiconductor module 12 (especially, relative to the facing surface 32a of the heat sink plate 32). The displacement amount of the facing surface 40a of the cooling plate 40 is adjusted in accordance with the temperature of the semiconductor module 12 due to the heater controller 58 adjusting the heat generation amount in the heater 50 in accordance with temperature of the semiconductor module 12.

Figure 2:
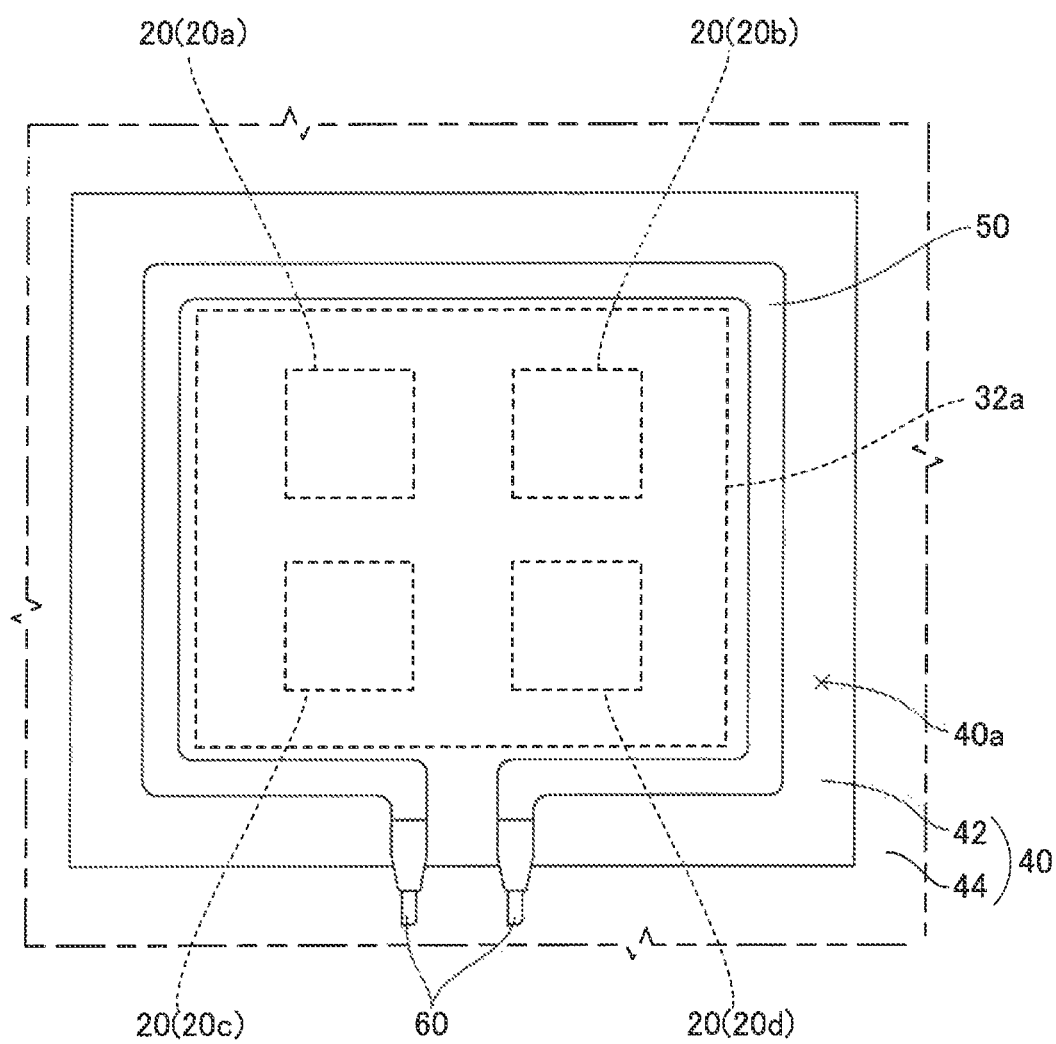
FIG. 2 shows a plan view of a cooling plate 40 in the semiconductor device 10 of the first embodiment. In this drawing, a positional relationship of a plurality of semiconductor elements 20 and a facing surface 32a of a heat sink plate 32 is shown by broken lines.
Figure 3:
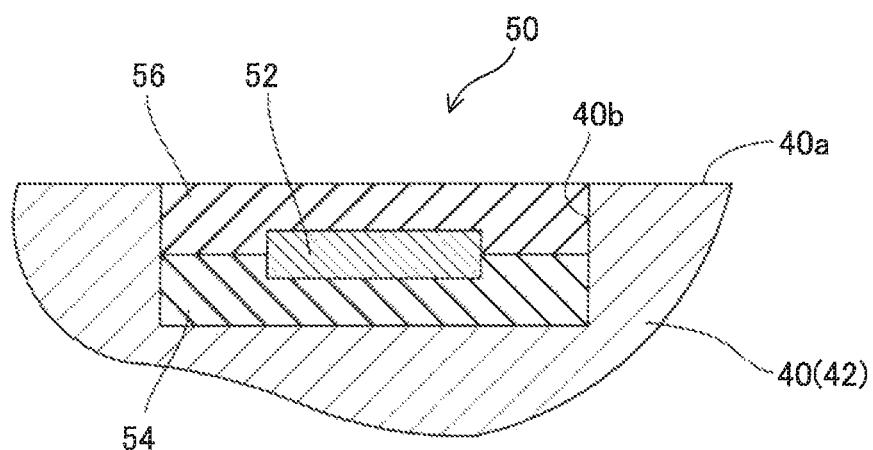
FIG. 3 shows a lateral cross sectional view of a heater 50.
Figure 4:
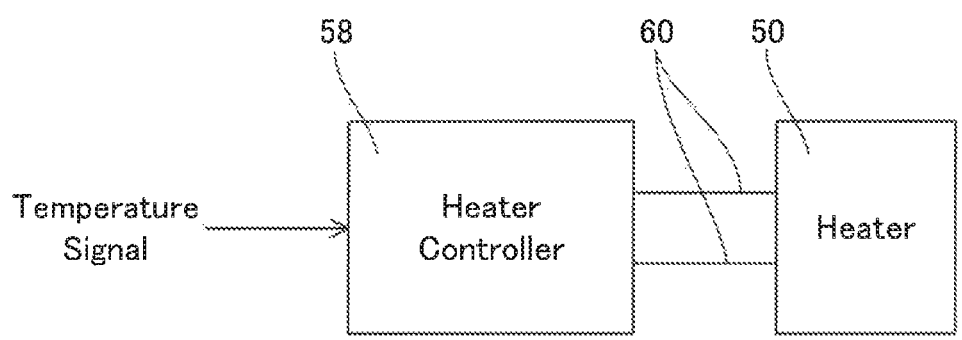
FIG. 4 is a block diagram showing the heater 50 and a heater controller 58.

Specific configuration of the heater 50 is not particularly limited. Although this is merely an example, the heater 50 of the present embodiment is an electric heater that generates Joule heat. As shown in FIGS. 2 and 3, the heater 50 has a structure in which a conductive resistance wire 52 such as stainless steel is covered by insulative base film 54 and cover film 56. The heater 50 is located in the facing surface 40a of the cooling plate 40 along an outer edge of a range facing the facing surface 32a of the heat sink plate 32. The heater 50 is located in a groove 40b provided in the cooling plate 40, and is fixed for example by adhesive. The heater 50 is connected to the heater controller 58 via an electric cable 60. The heater controller 58 adjusts the heat generation amount in the heater 50 by adjusting current to be supplied to the heater 50 for example by a pulse width modulation (PWM) control.

Figure 5:
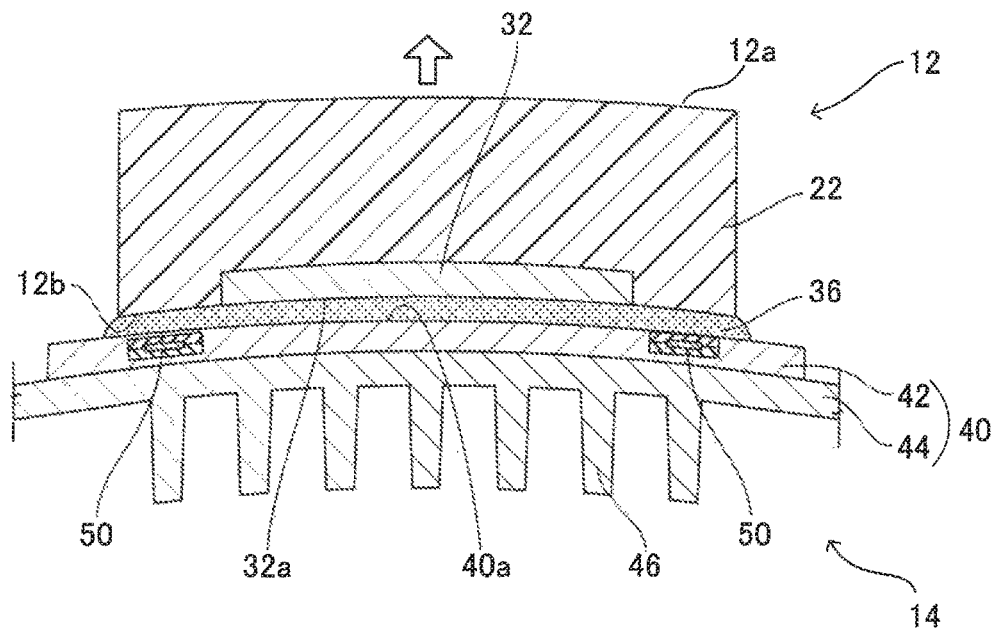
FIG. 5 schematically shows shapes of a semiconductor module 12 and the cooling plate 40 at room temperature.
Figure 6:
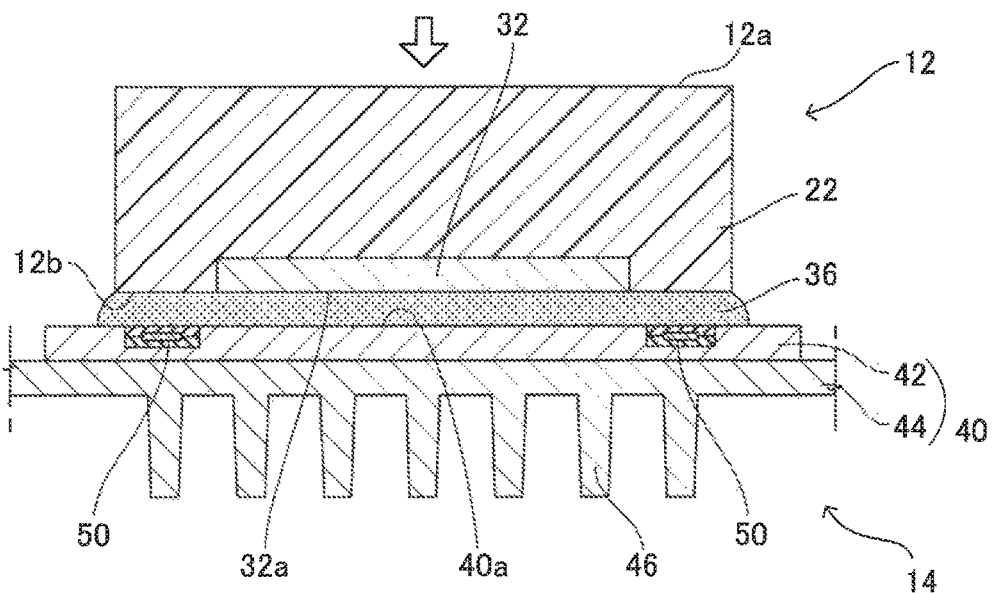
FIG. 6 schematically shows the shapes of the semiconductor module 12 and the cooling plate 40 at temperature higher than the room temperature.

Next, a behavior and an operation of the semiconductor device 10 will be described with reference to FIGS. 5 and 6. FIG. 5 schematically shows shapes of the semiconductor module 12 and the cooling plate 40 at room temperature. As shown in FIG. 5, the semiconductor module 12 may be warped even at the room temperature due to its thermal history upon molding of the molded resin 22. In this case, the shape of the cooling plate 40 at the room temperature may be designed complying with the shape of the semiconductor module 12 at the room temperature. In an example shown in FIG. 5, the semiconductor module 12 is deformed at the room temperature such that the lower surface 12b of the semiconductor module 12 has a concave shape. In this case, the shape of the cooling plate 40 at the room temperature may be designed such that the facing surface 40a of the cooling plate 40 also has a concave shape. That is, details of specification of the bimetal structure of the cooling plate 40 may be designed as above. It should be noted that, in FIG. 5, deformations of the semiconductor module 12 and the cooling plate 40 are depicted with emphasis for the sake of easier understanding of the explanation.

When current flows in the semiconductor elements 20, the semiconductor elements 20 generate heat, and the temperature of the semiconductor module 12 rises. As shown in FIG. 6, when the temperature of the semiconductor module 12 rises, the semiconductor module 12 deforms due to thermal expansion of each constituent element of the semiconductor module 12. The deformation of the semiconductor module 12 causes the facing surface 32a of the heat sink plate 32 facing the cooling plate 40 to displace relative to the cooling plate 40. In an example shown in FIG. 6, the semiconductor module 12 is deformed to become flat so that the facing surface 32a of the heat sink plate 32 deforms towards the cooling plate 40. Notably, the manner in which the semiconductor module 12 deforms may differ in accordance with configurations of the semiconductor module 12. That is, depending on the configuration of the semiconductor module 12, the facing surface 32a of the heat sink plate 32 may displace away from the cooling plate 40 when the temperature of the semiconductor module 12 rises.

The temperature of the cooling plate 40 rises accompanying the rise in the temperature of the semiconductor module 12. When the temperature of the cooling plate 40 rises, deformation takes place in the cooling plate 40 as well by thermal expansion of the bimetal structure (i.e., the first metal layer 42 and the second metal layer 44). The facing surface 40a of the cooling plate 40 facing the heat sink plate 32 displaces relative to the heat sink plate 32 due to the deformation of the cooling plate 40. Here, in the cooling plate 40 of the present embodiment, the linear expansion coefficient of the second metal layer 44 is larger than the linear expansion coefficient of the first metal layer 42. Thus, the facing surface 40a of the cooling plate 40 displaces away from the heat sink plate 32. At this occasion, the facing surface 40a of the cooling plate 40 displaces in a same direction as the facing surface 32a of the heat sink plate 32 (downward in FIGS. 5 and 6). Due to this, even when the temperature of the semiconductor module 12 changes, a change in a distance between the two facing surfaces 32a, 40a intervening the thermal grease 36 therebetween is suppressed. That is, a pump-out effect of the thermal grease 36 is suppressed.

A deformation amount of the semiconductor module 12 by its thermal expansion changes depending on the configuration of the semiconductor module 12. Due to this, the bimetal structure of the cooling plate 40 may be designed in accordance with the configuration of the semiconductor module 12, by which the pump-out effect of the thermal grease 36 can effectively be suppressed. However, since semiconductor modules 12 are industrial products, such products exhibit individual differences even among a group of products having same configurations. That is, even between two semiconductor modules 12 being of a same type, there may be a difference in their deformation amounts related to thermal expansion. Although bimetal structures of cooling plates 40 may individually be designed in accordance with such individual differences among the products, this is not industrially pragmatic.

Regarding the above point, the semiconductor device 10 of the present embodiment is provided with an adjuster that includes the heater 50 and the heater controller 58. As aforementioned, the adjuster is configured to adjust the displacement amount of the facing surface 40a of the cooling plate 40 in accordance with the temperature of the semiconductor module 12. The pump-out effect of the thermal grease 36 can effectively be suppressed regardless of the individual differences among the products, by measuring the actual deformation amount according to the temperature of the semiconductor module 12 and setting operation configurations of heater controllers 58 based on differences from a designed value.

Further, although the temperature of the cooling plate 40 changes in accordance with the temperature of the semiconductor module 12, there may be a delay in temperature change of the cooling plate 40 relative to the change in the temperature of the semiconductor module 12. Even in such a case, the pump-out effect of the thermal grease 36 can effectively be suppressed despite the delay in the temperature change of the cooling plate 40 by adjusting the displacement amount of the facing surface 40a of the cooling plate 40 by the adjuster.

Figure 7:
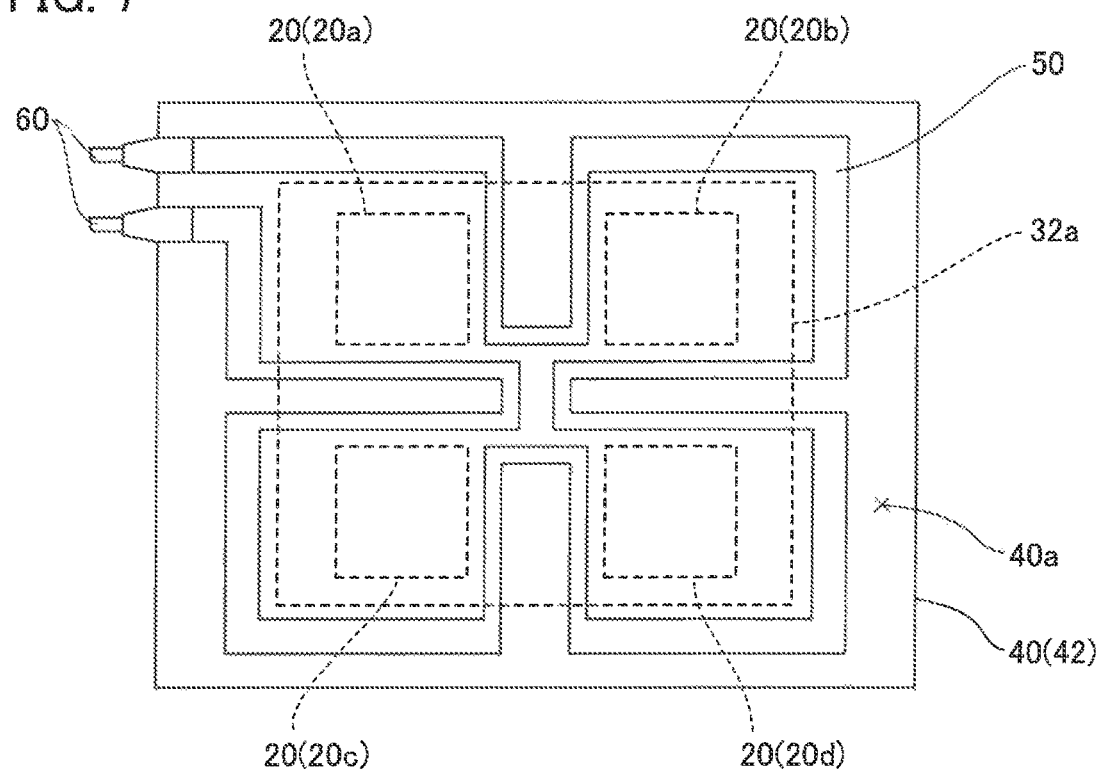
FIG. 7 shows a variant of the heater 50.
Figure 8:
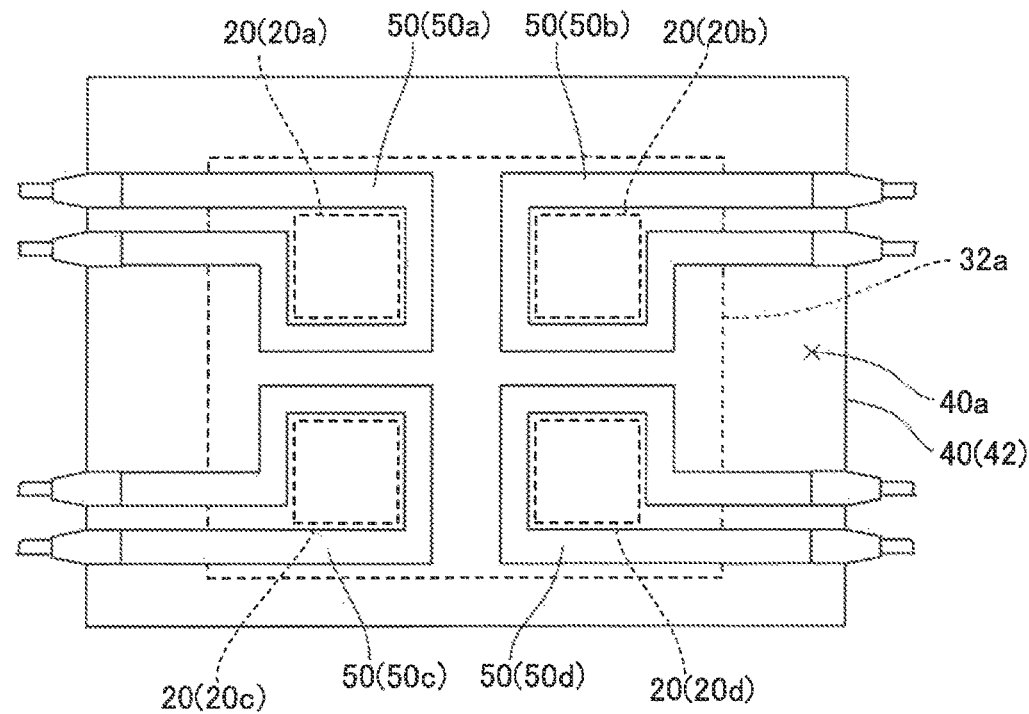
FIG. 8 shows another variant of the heater 50, and is a diagram showing a plurality of heaters 50a to 50d.

In the aforementioned first embodiment, the configuration of the heater 50 can suitably be modified. For example as shown in FIG. 7, the heater 50 may be located not only along the outer edge of the range facing the facing surface 32a of the heat sink plate 32, but also to extend within this range. Further, as shown in FIG. 8, the heater 50 may include a plurality of heaters 50a to 50d. In an example shown in FIG. 8, the plurality of heaters 50a to 50d includes a first heater 50a, a second heater 50b, a third heater 50c, and a fourth heater 50d. The first heater 50a heats a range within the facing surface 40a of the cooling plate 40 that is close to the first semiconductor element 20a, and the second heater 50b heats a range within the facing surface 40a of the cooling plate 40 that is close to the second semiconductor element 20b. Similarly, the third heater 50c heats a range within the facing surface 40a of the cooling plate 40 that is close to the third semiconductor element 20c, and the fourth heater 50d heats a range within the facing surface 40a of the cooling plate 40 that is close to the fourth semiconductor element 20d. Each of the ranges close to the respective semiconductor elements herein means a range that includes at least a position on the facing surface 40a closest to the corresponding semiconductor element. The plurality of heaters 50a to 50d may be controlled collectively or individually by the heater controller 58. Although this is merely an example, the heater controller 58 may adjust a heat generation amount of the first heater 50a in accordance with temperature of the first semiconductor element 20a, and may adjust a heat generation amount of the second heater 50b in accordance with temperature of the second semiconductor element 20b. Similarly, the heater controller 58 may adjust a heat generation amount of the third heater 50c in accordance with temperature of the third semiconductor element 20c, and may adjust a heat generation amount of the fourth heater 50d in accordance with temperature of the fourth semiconductor element 20d. According to such an embodiment, the displacement amount of the facing surface 40a of the cooling plate 40 can suitably be adjusted in accordance with the temperatures of the semiconductor elements 20a to 20d even in a case where the temperatures of the semiconductor elements 20a to 20d differ from each other.

Figure 9:
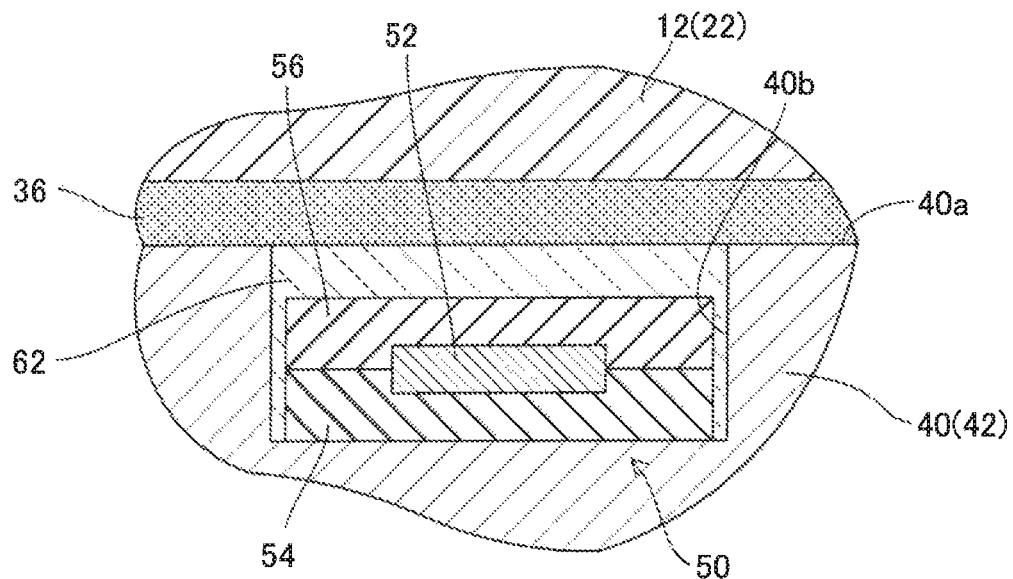
FIG. 9 is a lateral cross sectional view showing a variant of a structure for retaining the heater 50.
Figure 10:
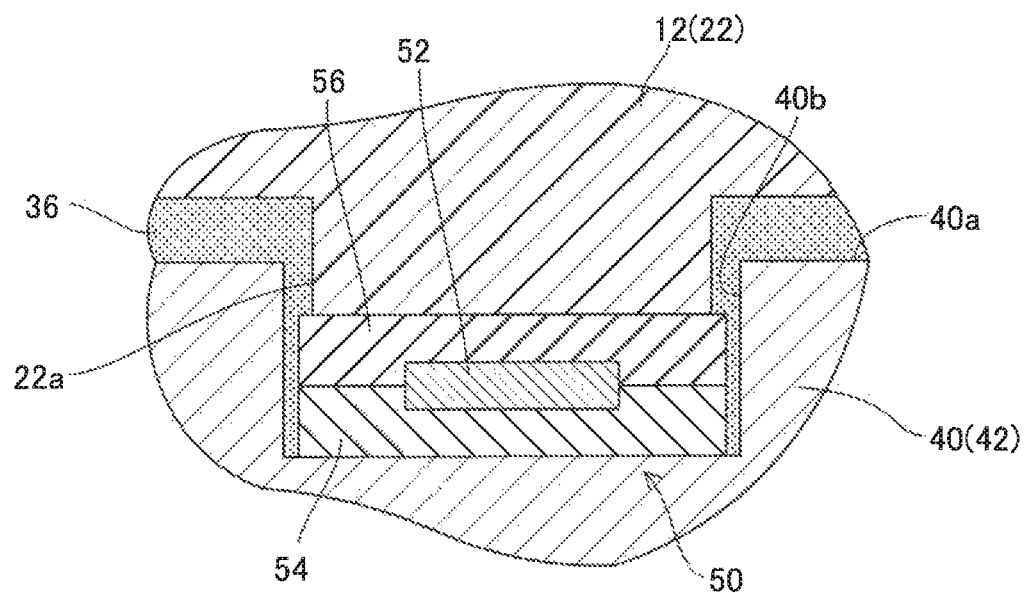
FIG. 10 is a lateral cross sectional view showing another variant of the structure for retaining the heater 50.

As shown in FIG. 9, the heater 50 may be covered by a heat insulating material 62. In this case, the heat insulating material 62 may have a lower thermal conductivity than the thermal grease 36. By intervening the heat insulating material 62 between the semiconductor module 12 and the heater 50, heat from the heater 50 can be suppressed from propagating to the semiconductor module 12. Although this is merely an example, the heat insulating material 62 may be a liquid curable sealing material, by which the heater 50 can be fixed in the groove 40b of the cooling plate 40. Alternatively, as shown in FIG. 10, a protrusion 22a arranged within the groove 40b of the cooling plate 40 may be provided in the molded resin 22 of the semiconductor module 12. According to such a configuration, the heater 50 can be retained in the groove 40b without using adhesive or sealing material, for example.

Second Embodiment

Figure 11:
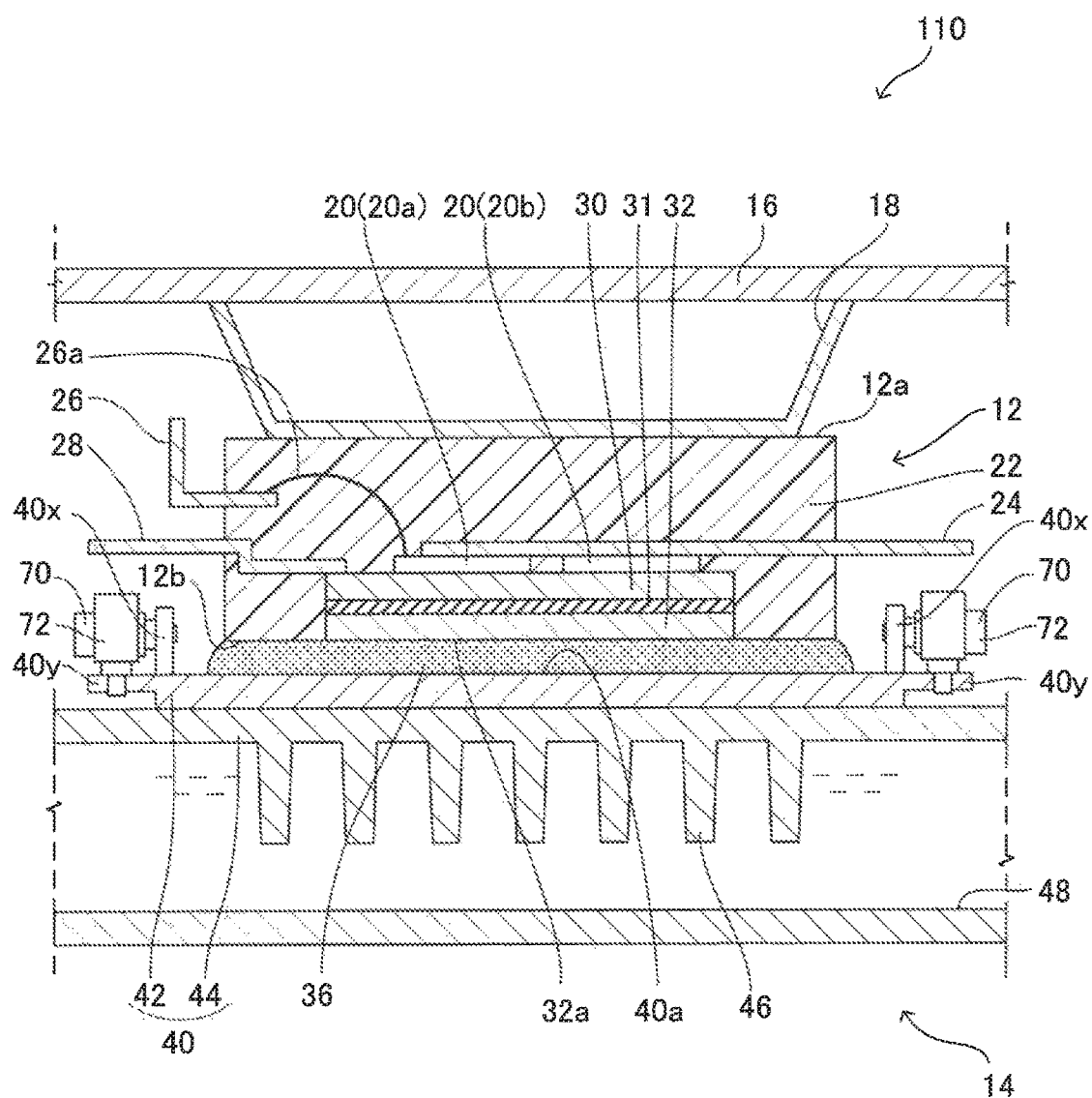
FIG. 11 schematically shows a configuration of a semiconductor device 110 of a second embodiment.
Figure 12:
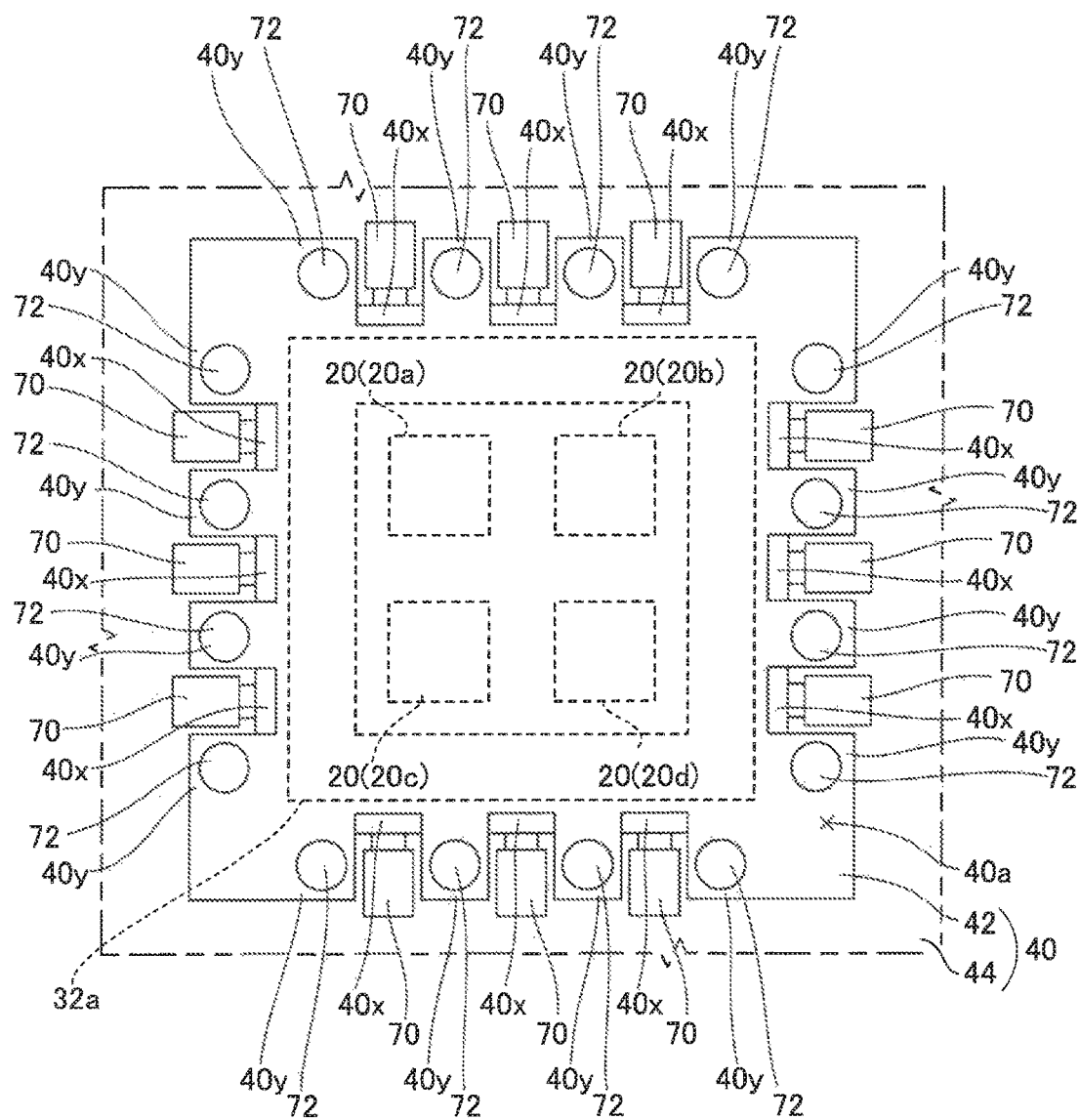
FIG. 12 shows a plan view of a cooling plate 40 in the semiconductor device 110 of the second embodiment. In this drawing, a positional relationship of a plurality of semiconductor elements 20 and a facing surface 32a of a heat sink plate 32 is shown by broken lines.
Figure 13:
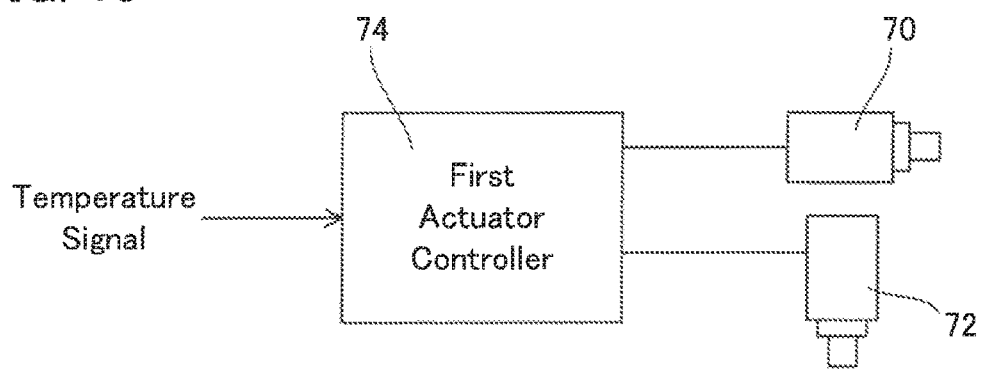
FIG. 13 is a block diagram showing plate actuators 70, 72 and a first actuator controller 74.

FIGS. 11 to 13 show a semiconductor device 110 of a second embodiment. The semiconductor device 110 of the second embodiment has its configuration of the adjuster modified as compared to the semiconductor device 10 of the first embodiment. That is, the semiconductor device 110 of the second embodiment includes a plurality of plate actuators 70, 72, and a first actuator controller 74 configured to control the plurality of plate actuators 70, 72 instead of the heater 50 and the heater controller 58 as explained in the first embodiment. The plurality of plate actuators 70, 72 and the first actuator controller 74 are examples of the adjuster configured to adjust the displacement amount of the facing surface 40a of the cooling plate 40 in accordance with the temperature of the semiconductor module 12.

The plurality of plate actuators 70, 72 is each configured to deform the cooling plate 40 by applying force to the cooling plate 40. Each of the plate actuators 70, 72 may for example be a cylinder device. The plurality of plate actuators 70, 72 includes a plurality of first actuators 70 and a plurality of second actuators 72. A direction along which the first actuators 70 apply force is a direction parallel to the facing surface 40a of the cooling plate 40, and a direction along which the second actuators 72 apply force is a direction perpendicular to the facing surface 40a of the cooling plate 40. The plurality of plate actuators 70, 72 is arranged along a peripheral edge of the first metal layer 42. The cooling plate 40 is provided with a plurality of first connections 40x, each of which is connected to a corresponding one of the plurality of first actuators 70, and a plurality of second connections 40y, each of which is connected to a corresponding one of the plurality of second actuators 72. Each of the first connections 40x protrudes perpendicular to the facing surface 40a of the cooling plate 40, and each of the second connections 40y protrudes parallel to the facing surface 40a of the cooling plate 40.

Figure 14:
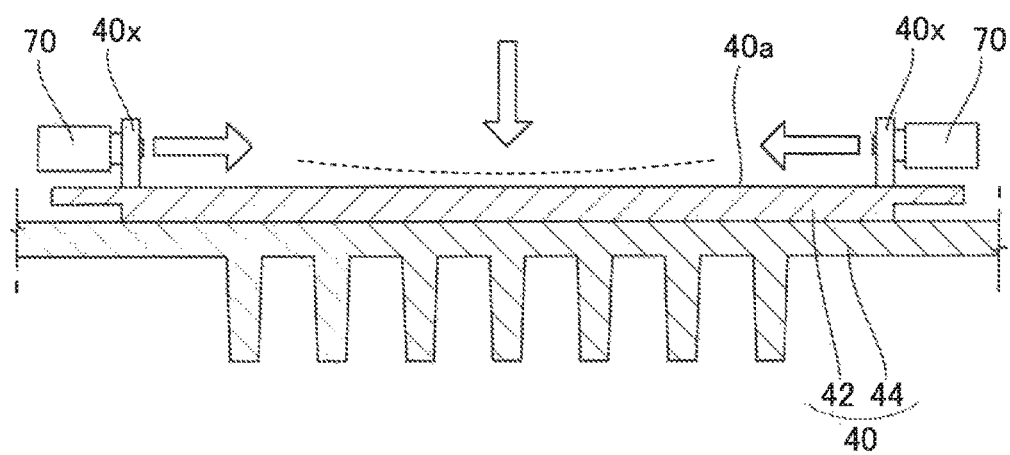
FIG. 14 shows deformation of the cooling plate 40 by the first actuator 70.
Figure 15:
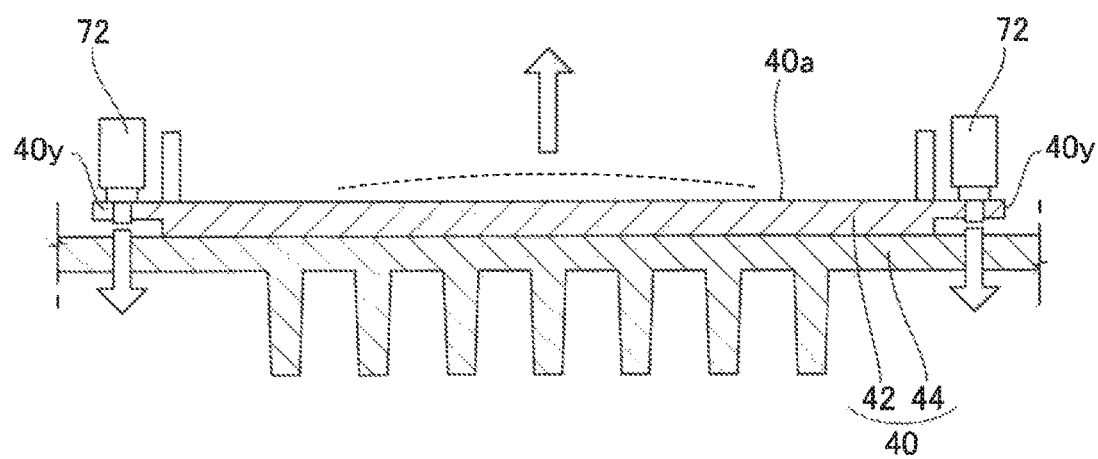
FIG. 15 shows deformation of the cooling plate 40 by the second actuator 72.

As shown in FIG. 14, when the plurality of first actuators 70 presses the plurality of first connections 40x of the cooling plate 40, the cooling plate 40 deforms such that the facing surface 40a of the cooling plate 40 comes to have a concave shape. On the other hand, as shown in FIG. 15, when the plurality of second actuators 72 presses the plurality of second connections 40y of the cooling plate 40, the cooling plate 40 deforms such that the facing surface 40a of the cooling plate 40 comes to have a convex shape. The first actuator controller 74 controls operations of the plurality of plate actuators 70, 72 in accordance with the temperature of the semiconductor module 12. Due to this, the displacement amount of the facing surface 40a of the cooling plate 40 is adjusted in accordance with the temperature of the semiconductor module 12.

In the semiconductor device 110 of the second embodiment as well, the adjuster including the plurality of plate actuators 70, 72 and the first actuator controller 74 is provided, and the displacement amount of the facing surface 40a of the cooling plate 40 can be adjusted in accordance with the temperature of the semiconductor module 12. Due to this, the pump-out effect of the thermal grease 36 can effectively be suppressed regardless of individual differences in thermal deformation among semiconductor modules 12. Further, the pump-out effect of the thermal grease 36 can effectively be suppressed even in the event where the temperature change of the cooling plate 40 exhibits a delay.

Figure 16:
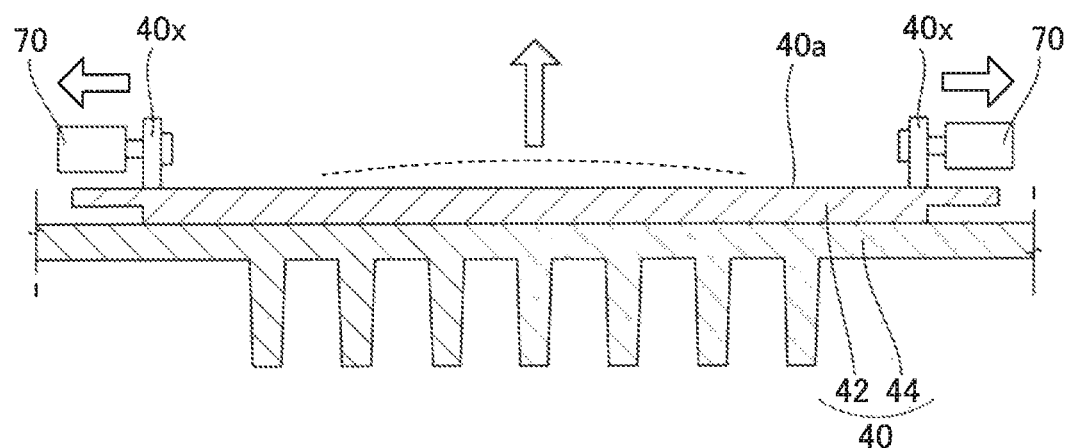
FIG. 16 shows the deformation of the cooling plate 40 by the first actuator 70 in a variant.
Figure 17:
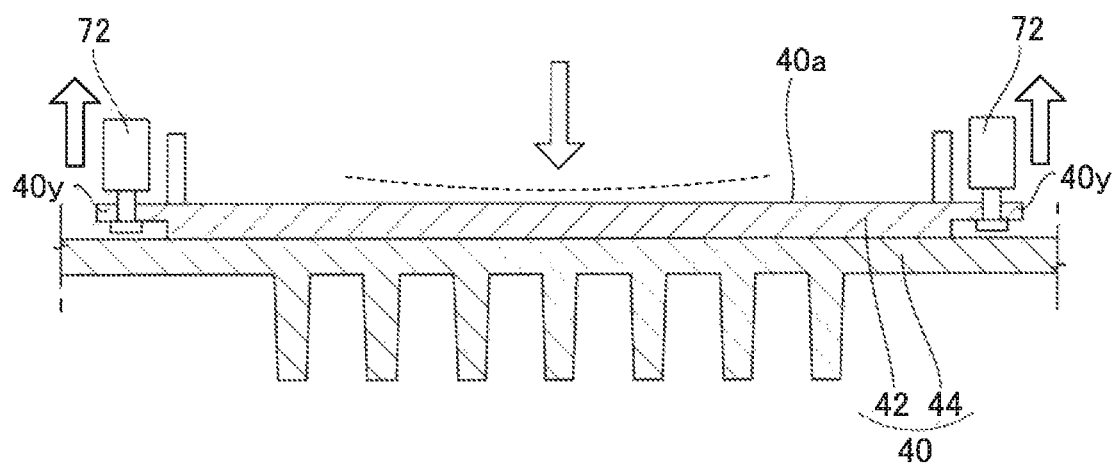
FIG. 17 shows deformation of the cooling plate 40 by the second actuator 72 in a variant.

As shown in FIGS. 16 and 17, the first actuators 70 and the second actuators 72 may be configured to apply tensile stress on the cooling plate 40. In this case, as shown in FIG. 16, when the plurality of first actuators 70 pulls the plurality of first connections 40x of the cooling plate 40, the cooling plate 40 deforms such that the facing surface 40a of the cooling plate 40 comes to have the convex shape. On the other hand, as shown in FIG. 17, when the plurality of second actuators 72 pulls the plurality of second connections 40y of the cooling plate 40, the cooling plate 40 deforms such that the facing surface 40a of the cooling plate 40 comes to have the concave shape.

Numbers and configurations of the plate actuators 70, 72 are not particularly limited. For example, the plate actuators 70, 72 may be located within the cooler 14, and may directly press or pull the cooling plate 40 from an inner surface side thereof. Further, the semiconductor device 110 of the second embodiment may further include the adjuster of the first embodiment (that is, the heater 50 and the heater controller 58).

Third Embodiment

Figure 18:
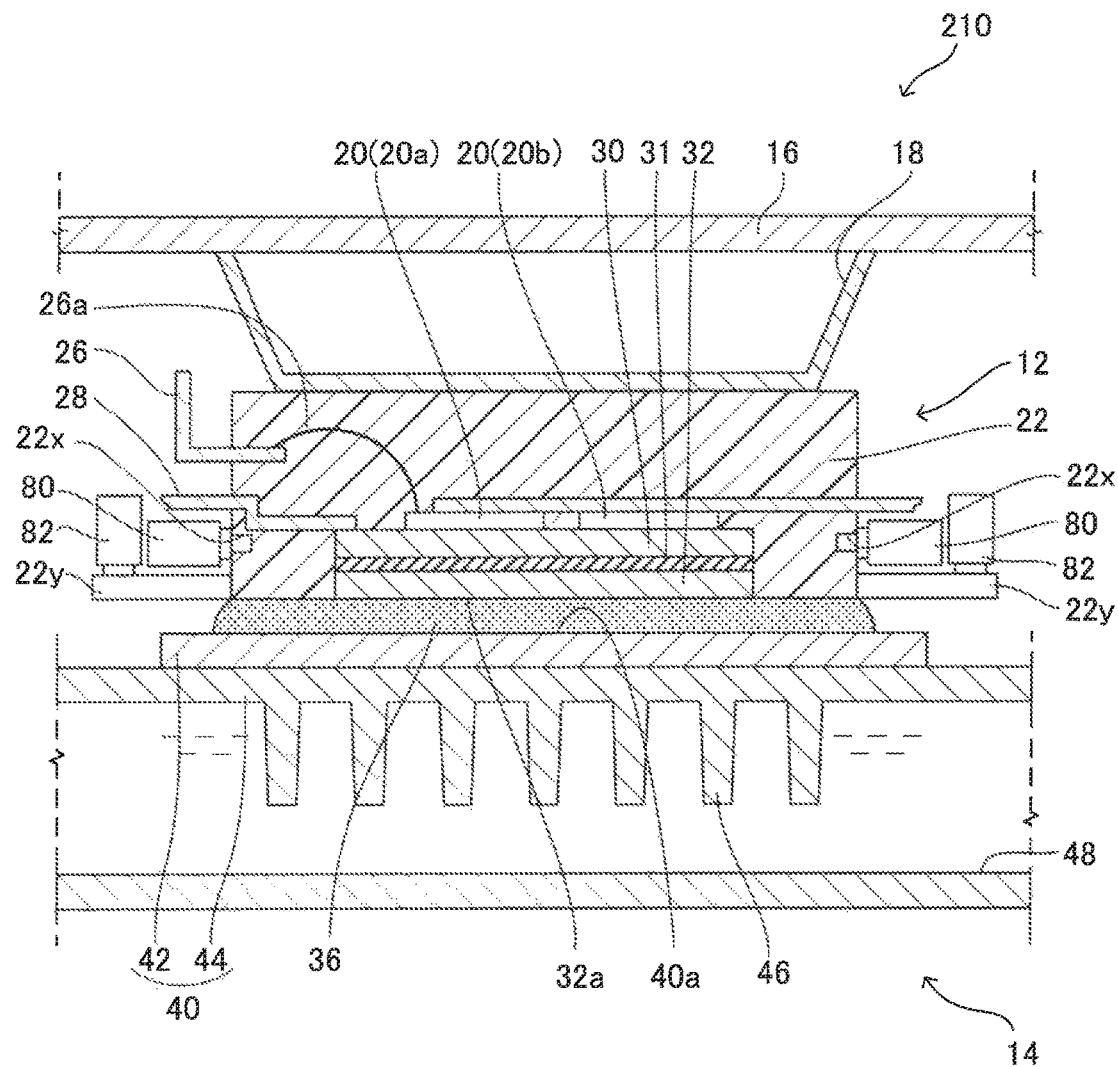
FIG. 18 schematically shows a configuration of a semiconductor device 210 of a third embodiment.
Figure 19:
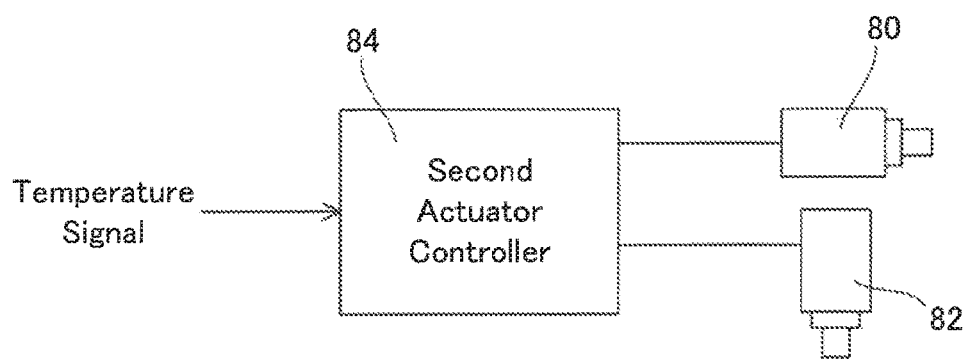
FIG. 19 is a block diagram showing module actuators 80, 82 and a second actuator controller 84.

FIGS. 18 and 19 show a semiconductor device 210 of a third embodiment. The semiconductor device 210 of the third embodiment has its configuration of the adjuster modified as compared to the semiconductor device 10 of the first embodiment. That is, the semiconductor device 210 of the third embodiment includes a plurality of module actuators 80, 82, and a second actuator controller 84 configured to control the plurality of module actuators 80, 82 instead of the heater 50 and the heater controller 58 as explained in the first embodiment. The plurality of module actuators 80, 82 and the second actuator controller 84 are examples of the adjuster configured to adjust the displacement amount of the facing surface 32a of the heat sink plate 32 of the semiconductor module 12 in accordance with the temperature of the semiconductor module 12.

The plurality of module actuators 80, 82 can apply force to the semiconductor module 12 to deform the semiconductor module 12. Each of the module actuators 80, 82 may for example be a cylinder device. The plurality of module actuators 80, 82 includes a plurality of third actuators 80 and a plurality of fourth actuators 82. A direction along which the third actuators 80 apply force is a direction parallel to the facing surface 32a of the heat sink plate 32, and a direction along which the fourth actuators 82 apply force is a direction perpendicular to the facing surface 32a of the heat sink plate 32. The plurality of module actuators 80, 82 arranged along a peripheral edge of the molded resin 22. The molded resin 22 is provided with a plurality of third connections 22x, each of which is connected to a corresponding one of the plurality of third actuators 80, and a plurality of fourth connections 22y, each of which is connected to a corresponding one of the plurality of fourth actuators 82. Each of the third connections 22x is provided on a side surface of the molded resin 22 that is perpendicular to the facing surface 32a of the heat sink plate 32, and each of the fourth connections 22y protrudes in a direction parallel to the facing surface 32a of the heat sink plate 32.

The second actuator controller 84 controls operations of the plurality of module actuators 80, 82 in accordance with the temperature of the semiconductor module 12. Due to this, the deformation amount of the semiconductor module 12 is adjusted in accordance with the temperature of the semiconductor module 12, as a result of which a displacement amount of the facing surface 32a of the heat sink plate 32 is adjusted. That is, as compared to the semiconductor device 110 of the second embodiment, the semiconductor device 210 of the third embodiment adjusts the displacement amount of the facing surface 32a of the heat sink plate 32 instead of the displacement amount of the facing surface 40a of the cooling plate 40. According to such a configuration as well, similar to the adjuster in the first or second embodiment, the pump-out effect of the thermal grease 36 can effectively be suppressed regardless of the individual differences in thermal deformation among the semiconductor modules 12 and the delays in the temperature change of the cooling plates 40.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
 a semiconductor module comprising at least one semiconductor element encapsulated within a molded resin and a heat sink plate exposed on a surface of the molded resin; and
 a cooler comprising a cooling plate located on the heat sink plate of the semiconductor module via thermal grease,
 wherein the cooling plate comprises a bimetal structure in winch a first metal layer and a second metal layer are laminated, the second metal layer having a different linear expansion coefficient from the first metal layer,
 the heat sink plate comprises a first facing surface facing the cooling plate, the semiconductor module being configured to thermally expand with a rise in temperature of the semiconductor module such that the first facing surface displaces with respect to the cooling plate, and
 the cooling plate comprises a second facing surface facing the heat sink plate, the bimetal structure of the cooling plate being configured to thermally expand with a rise in temperature of the cooling plate such that the second facing surface of the cooling plate displaces in a same direction as the first facing surface of the heat sink plate.

2. The semiconductor device according to claim 1, further comprising an adjuster configured to adjust an amount of displacement of at least one of the first facing surface of the heat sink plate and the second facing surface of the cooling plate in accordance with the temperature of the semiconductor module.

3. The semiconductor device according to claim 2, wherein
 the adjuster comprises:
 at least one heater configured to heat the cooling plate; and
 a heater controller configured to adjust an amount of heat generation of the at least one heater in accordance with the temperature of the semiconductor module.

4. The semiconductor device according to claim 3, wherein
 the at least one semiconductor element comprises a first semiconductor element and a second semiconductor element,
 the at least one heater comprises:
 a first heater configured to heat the second facing surface of the cooling plate a first range close to the first semiconductor element; and
 a second heater configured to heat the second facing surface of the cooling plate in a second range close to the second semiconductor element, and
 the heater controller is configured to adjust an amount of heat generation of the first heater in accordance with temperature of the first semiconductor element and adjust an amount of heat generation of the second heater in accordance with temperature of the second semiconductor element.

5. The semiconductor device according to claim 2, wherein
 the adjuster comprises:
 a plate actuator configured to deform the cooling plate by applying force to the cooling plate; and
 a first actuator controller configured to adjust an operation of the plate actuator in accordance with the temperature of the semiconductor module.

6. The semiconductor device according to claim 2, wherein
 the adjuster comprises:
 a module actuator configured to deform the semiconductor module by applying force to the semiconductor module; and
 an actuator controller configured to adjust an operation of the module actuator in accordance with the temperature of the semiconductor module.

* * * * *